United States Patent

Hashimoto

[11] Patent Number: 6,096,232
[45] Date of Patent: Aug. 1, 2000

[54] DRY ETCHING SYSTEM AND DRY ETCHING METHOD USING PLASMA

[75] Inventor: Toshiki Hashimoto, Tokyo, Japan

[73] Assignee: NEC Corporation, Tokyo, Japan

[21] Appl. No.: 08/874,722

[22] Filed: Jun. 13, 1997

[30] Foreign Application Priority Data

Jun. 14, 1996 [JP] Japan ..................................... 8-154685

[51] Int. Cl.[7] .............................. G01N 21/00; H01L 21/00
[52] U.S. Cl. .............................. 216/60; 216/68; 156/345; 438/9
[58] Field of Search .............................. 156/345; 216/60, 216/68; 438/9; 118/723 I

[56] References Cited

U.S. PATENT DOCUMENTS

| | | | |
|---|---|---|---|
| 5,308,414 | 5/1994 | O'Neill et al. | 216/60 |
| 5,474,650 | 12/1995 | Kumihashi et al. | 156/345 X |
| 5,690,781 | 11/1997 | Yoshida et al. | 156/345 |
| 5,702,562 | 12/1997 | Wakahara | 216/60 X |

FOREIGN PATENT DOCUMENTS

| | | |
|---|---|---|
| 6-84811 | 3/1994 | Japan . |
| 7-122544 | 5/1995 | Japan . |
| 8-55835 | 2/1996 | Japan . |

OTHER PUBLICATIONS

K. Yoshida et al., "Gate Electrode Etching Using a Transformer Coupled Plasma", pp. 2089–2094, Japan Journal of Applied Physics, vol. 34, Part 1, No. 4B, Apr. 1995.

*Primary Examiner*—Thi Dang
*Attorney, Agent, or Firm*—Young & Thompson

[57] ABSTRACT

A dry etching system capable of suppressing the effect of reaction products generated in a reaction chamber during an etching process to the edge profile of an etch object such as a semiconductor wafer. This system includes a reaction chamber in which an etching action is performed, a plasma generator for generating plasma in the reaction chamber, a holder for holding an etch object in the reaction chamber, a detector for detecting the quantity of a reaction product contained in the plasma, and a controller for controlling the amount of the reaction products contained in the plasma to be at least one specific value. The etch object is etched by the action of etching species contained in the plasma. The detector detects, for example, the intensity of light emission from the plasma at a specific wavelength. The controller preferably includes a distance adjuster for adjusting the distance between a dielectric plate and an induction coil, thereby controlling the amount of the reaction products contained in the plasma.

13 Claims, 8 Drawing Sheets

DRY ETCHING SYSTEM AND DRY ETCHING METHOD USING PLASMA

BACKGROUND OF THE INVENTION

1. Field of the Invention

The present invention relates to a dry etching system and a dry etching method and more particularly, to a dry etching system and a dry etching method using plasma, which are used for semiconductor device fabrication.

2. Description of the Prior Art

In recent years, with the progressing integration degree of semiconductor integrated circuit devices, dry etching systems using plasma have been broadly used, because they are capable of anisotropic etching.

In the dry etching systems of this sort, plasma is generated in a reaction chamber. The plasma typically contains active species such as neutral radicals and positively charged ions. The neutral radicals and the positive ions cooperatively serve to generate an etching action. The neutral radicals react with an "etch object", which is an object to be etched. They play a main role of the etching action. The ions give their energy to the exposed surface of the etch object by ion bombardment. The etching action generated by the radicals is assisted by the energy thus given by the ion bombardment.

To enhance the anisotropy of the etching, it is required for the positive ions to arrive on the surface of the etch object at an approximately right angle with respect to the surface of the object. In other words, the incident angle of the ions needs to have a value as close as possible to a right angle. However, it is not easy to realize that the incident angle of the ions has a value approximately equal to a right angle. This is because the ions are scattered by the collisions with the neutral molecules of a reaction gas introduced into the reaction chamber before they are contacted with the object.

If the pressure of the reaction gas in the reaction chamber is lowered to decrease the number of the neutral gas molecules and the probability of collision of the ions with the neutral gas molecules, the moving or traveling directions of the ions can be aligned to considerable extent. However, in this case, there arises a problem that the density of plasma itself is reduced.

So, improved dry etching systems were developed, which make it possible that an obtainable plasma density is satisfactorily high when the pressure of the reaction gas in the reaction chamber is low enough to align the moving directions of the ions. An example of the improved systems was disclosed in the Japanese Non-Examined Patent Publication No. 6-84811 published in March 1994.

FIG. 1 schematically shows the structure of an example of the conventional improved systems.

In this dry etching system shown in FIG. 1, a dielectric plate 105 is fixed to the top of a reaction chamber 101 electrically connected to the grounded. In the outside of the reaction chamber 101, a radio frequency (rf) induction coil 102 is fixed onto the dielectric plate 105. The coil 102 is a flat, spiral coil, which is formed on a flat plate. Both ends of conducting wires of the coil 102 are electrically connected to a rf power supply 103 arranged outside the reaction chamber 101.

A bottom electrode 109 is fixed to the bottom of the reaction chamber 101. The bottom electrode 109 is electrically connected to a rf power supply 104 arranged outside the reaction chamber 101. The top of the electrode 109 is located in the inside of the reaction chamber 101. A semiconductor wafer 108 is placed on the top of the electrode 109 as the etch object on operation.

A shield 113 is fixed to the chamber 101 in the reaction chamber 101. This shield 113 serves to protect the areas of the wafer 108 from the active etching species.

In the conventional dry etching system shown in FIG. 1, on operation, the reaction chamber 101 is exhausted to a fixed degree of vacuum and then, a specific reaction gas is introduced into the chamber 101 to represent a specific pressure. An rf electric current is supplied to the induction coil 102 from a rf power supply 103. Due to the electric current flowing through the coil 102, a rf magnetic-field (not illustrated) is induced within the reaction chamber 101 through the dielectric plate 105. This magnetic field is almost parallel to the plate 105. Because of the induced magnetic field, plasma (not illustrated) with a high density is able to be generated within the reaction chamber 101 even if the reaction gas in the chamber 101 has a low pressure.

On the bottom electrode 109 located to be opposite to the dielectric plate 105, a semiconductor wafer 108 is located as the etch object. When a rf voltage is applied to the electrode 109, a self-bias voltage will occur on the electrode 109. Due to this self-bias voltage, the ions contained in the plasma are able to arrive on the wafer 108 located on the electrode 109 along a direction almost perpendicular to the wafer 108. Thus, a highly anisotropic etching can be realized.

Generally, with the plasma etching or plasma-assisted etching, the etching action is generated by the chemical reactions of the neutral radicals with the etching object and by the ion-assisting effect of the ions due to the ion bombardment. It is effective to prevent the side etching of the etching object utilizing the "sidewall protection layer" for the purpose of etching the object more anisotropically with high preciseness.

The "sidewall protection layer" is formed during an etching process in such a way that so-called "reaction products" are deposited on the side faces of the remaining, etched object (i.e., unetched part) and of an overlying masking layer. The "reaction products" are generated by the chemical reactions of the sputtered materials from the object with the reaction gas in the reaction chamber 101.

It is needless to say that the reaction products are deposited on any areas other than the side faces of the unetched object. For example, the products are deposited on the inner surface of the dielectric plate 105, the exposed surface of a resist mask formed on the object, and the exposed surface of the object.

However, since the surface of the resist mask and the exposed surface of the etch object are almost perpendicular to the etching direction, no products tend to grow thereon. Specifically, on these surfaces, the etch rate of the object is greater than the growth rate thereof due to the effect of the ion bombardment and therefore, the reaction products will not be deposited thereon. As a result, the reaction products grows only on the side faces of the unetched object and the resist mask formed on the object, thereby selectively forming the sidewall protection layer.

The inner surface of the dielectric plate 105 is not affected by the ion bombardment. Therefore, the reaction products will grow on the inner surface of the plate 105 in the same way as those of the remaining, unetched object and the resist mask.

With the dry etching system shown by FIG. 1, the reaction products deposited on the inner surface of the dielectric plate 105 tend to be sputtered by the etching species, thereby emitting the reaction products in a gas phase into the chamber 101 again. The reaction products will be redeposited on the side faces of the remaining, unetched object. This redeposited products will affect the edge profile of the etch object, resulting in a problem that a wanted edge profile is not achieved.

This problem becomes conspicuous when a plurality of the semiconductor wafers 108 are successively etched by using the conventional dry etching system of FIG. 1. Specifically, in this case, the quantity of the vapor-phase reaction products existing in the reaction chamber 101 increases with the increasing number of the semiconductor wafers 108, thereby raising the quantity of the redeposited reaction products on the surface of the etch object. As a result, with increase of handling number of sheets, there is a problem that the edge shape of the etch object deviates from the wanted or designed one as the number of the etched wafers 108 increases.

SUMMARY OF THE INVENTION

Accordingly, an object of the present invention is to provide a dry etching system and a dry etching method that can suppress the effect of reaction products generated in a reaction chamber during an etching process to the edge profile of an etch object.

Another object of the present invention is to provide a dry etching system and a dry etching method in which each of a plurality of etch objects can have a wanted edge profile when the plurality of etch objects are successively etched in a same reaction chamber.

The above objects together with others not specifically mentioned will become clear to those skilled in the art from the following description.

According to a first aspect of the present invention, a dry etching system is provided. This system includes a reaction chamber in which an etching action is performed, a plasma generator for generating plasma in the reaction chamber, a holder for holding an etch object in the reaction chamber, a detector for detecting the quantity of a reaction product contained in the plasma, and a controller for controlling the amount of the reaction products contained in the plasma to be at least one specific value. The object is etched by the action of etching species contained in the plasma.

With the dry etching system according to the first aspect of the present invention, the quantity of the reaction product contained in the plasma can be controlled by using the detector and the controller to be at least one specific value. Therefore, the etch object can be etched while controlling the amount of the reaction product deposited on the object. As a result, the effect of the reaction product to the edge profile of the object can be suppressed.

Also, when a plurality of etch objects are successively etched in the reaction chamber, if the objects are etched while controlling the quantity of the reaction product contained in the plasma to be at least one specific value by using the detector and the controller, the edge profiles of the objects will be uniform. This means that each of the plurality of objects can have a wanted edge profile.

In a preferred embodiment of the dry etching system according to the first aspect, the detector detects the intensity of light emission from the plasma at a specific wavelength. In this case, there is an advantage that the quantity of the reaction product in the plasma can be controlled easily.

In another preferred embodiment of the dry etching system according to the first aspect, the plasma generator contains a dielectric plate fixed on the reaction chamber, a movable induction coil provided in the vicinity of the dielectric plate outside the reaction chamber, an electrode fixed to the chamber and serves as a holder for the etch object. The controller includes a distance adjuster for adjusting the distance between the dielectric plate and the induction coil, and a linker for linking the operations of the adjuster and the detector.

In this case, there is an advantage that the quantity of the reaction product in the plasma can be controlled easily.

According to a second aspect of the present invention, a dry etching method is provided. This method contains a step of preparing a reaction chamber into which a reaction gas has been introduced, a step of generating a plasma in the chamber, a step of dry etching an etch object in the chamber using the plasma to have a wanted profile. In the dry etching step, the quantity of the reaction product contained in the plasma is controlled to be at least one specific value.

With the dry etching method according to the second aspect, during the dry etching step, the quantity of the reaction product contained in the plasma is controlled to be at least one specific value. Therefore, the effect of the reaction product to the edge profile of the etch object can be suppressed.

Also, when a plurality of etch objects are successively etched in the reaction chamber, if the objects are etched while controlling the quantity of the reaction product contained in the plasma to be at least one specific value, the edge profiles of the objects will be uniform. This means that each of the plurality of objects can have a wanted edge profile.

In a preferred embodiment of the dry etching method according to the second aspect, the control of the quantity of the reaction product in the plasma is performed based on the detected emission intensity at a specific wavelength. In this case, there is an advantage that the quantity of the reaction product in the plasma can be controlled easily.

In another preferred embodiment of the dry etching method according to the second aspect, the control of the quantity of the reaction product in the plasma is performed using a dielectric plate fixed to the reaction chamber and a movable induction coil provided in the vicinity of the plate outside the chamber in such a way that the distance between the dielectric plate and the induction coil is adjusted to be the at least one specific value.

In this case, there is an advantage that the quantity of the reaction product in the plasma can be controlled easily.

It is preferred that the reaction chamber, the dielectric plate, and the etching object have a temperature gradient, because there is an advantage that the quantity of the deposited reaction product of the etch object is further increased.

In still another preferred embodiment of the dry etching method according to the second aspect, after the end point of the above dry etching step is detected, a step of increasing the quantity of the reaction product in the plasma and a step of overetching the object are additionally performed.

In this case, there is an additional advantage that the etching selectivity is improved.

This embodiment having the overetching step can be preferably applied to the case of etching a polysilicon layer to form a polysilicon gate electrode of a Metal-Oxide-Semiconductor Field-Effect Transistor (MOSFET).

According to a third aspect of the present invention, another dry etching method is provided. This method contains a step of preparing a reaction chamber into which a reaction gas has been introduced, a step of generating a plasma in the chamber, a step of dry etching a first etch object in the chamber using the plasma to have a wanted profile, a step of dry etching a second etch object in the chamber using the plasma to have the wanted profile.

In the dry etching step for the first etch object, the quantity of the reaction product contained in the plasma is detected to be stored as a reference value. In the dry etching step for the second etch object, the quantity of the reaction product contained in the plasma is controlled to be equal to the reference value.

With the dry etching method according to the third aspect, during the dry etching step for the second etch object, the quantity of the reaction product contained in the plasma is controlled to be equal to the reference value. Therefore, the edge profiles of the first and second objects will be uniform. This means that each of the first and second objects can have a wanted edge profile.

In a preferred embodiment of the dry etching method according to the third aspect, the control of the quantity of the reaction product in the plasma is performed based on the detected emission intensity at a specific wavelength. In this case, there is an advantage that the quantity of the reaction product in the plasma can be controlled easily.

In another preferred embodiment of the dry etching method according to the third aspect, the control of the quantity of the reaction product in the plasma is performed using a dielectric plate fixed to the reaction chamber and a movable induction coil provided in the vicinity of the plate outside the chamber in such a way that the distance between the dielectric plate and the induction coil is adjusted to be the at least one specific value.

In this case, there is an advantage that the quantity of the reaction product in the plasma can be controlled easily.

It is preferred that the reaction chamber, the dielectric plate, and the etching object have a temperature gradient, because there is an advantage that the quantity of the deposited reaction product of the etch object is further increased.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
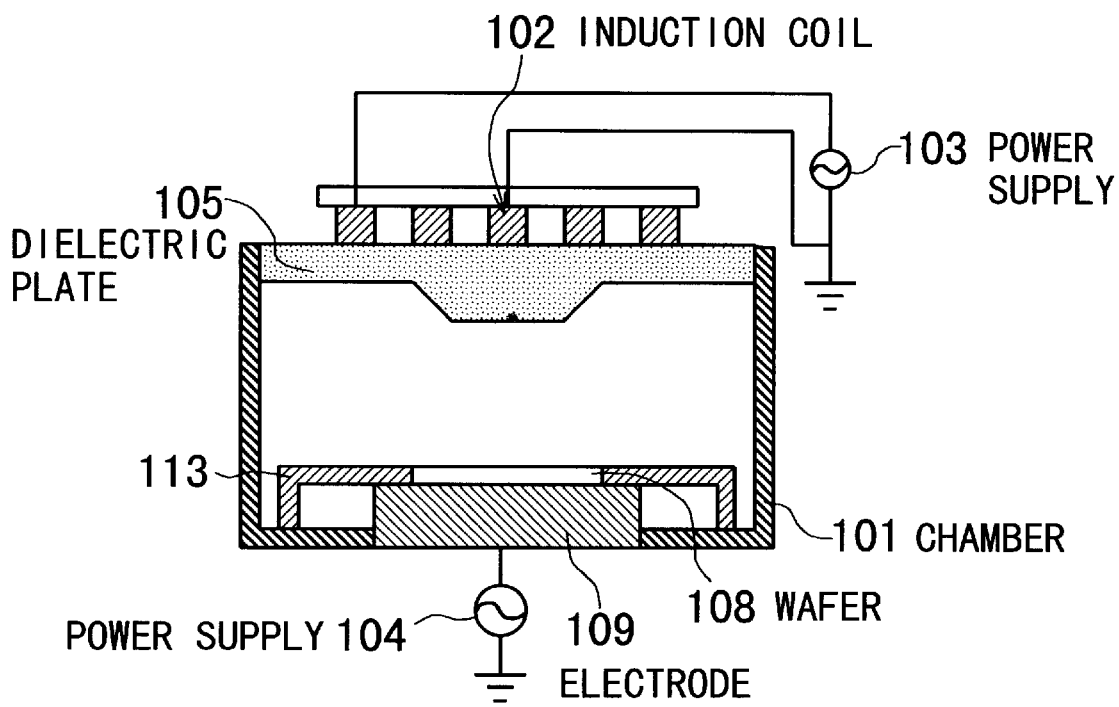
FIG. 1 is a schematic cross section of a conventional dry etching system.

Preferred embodiments of the present invention will be described below referring to the drawings figures.

FIRST EMBODIMENT

Figure 2:
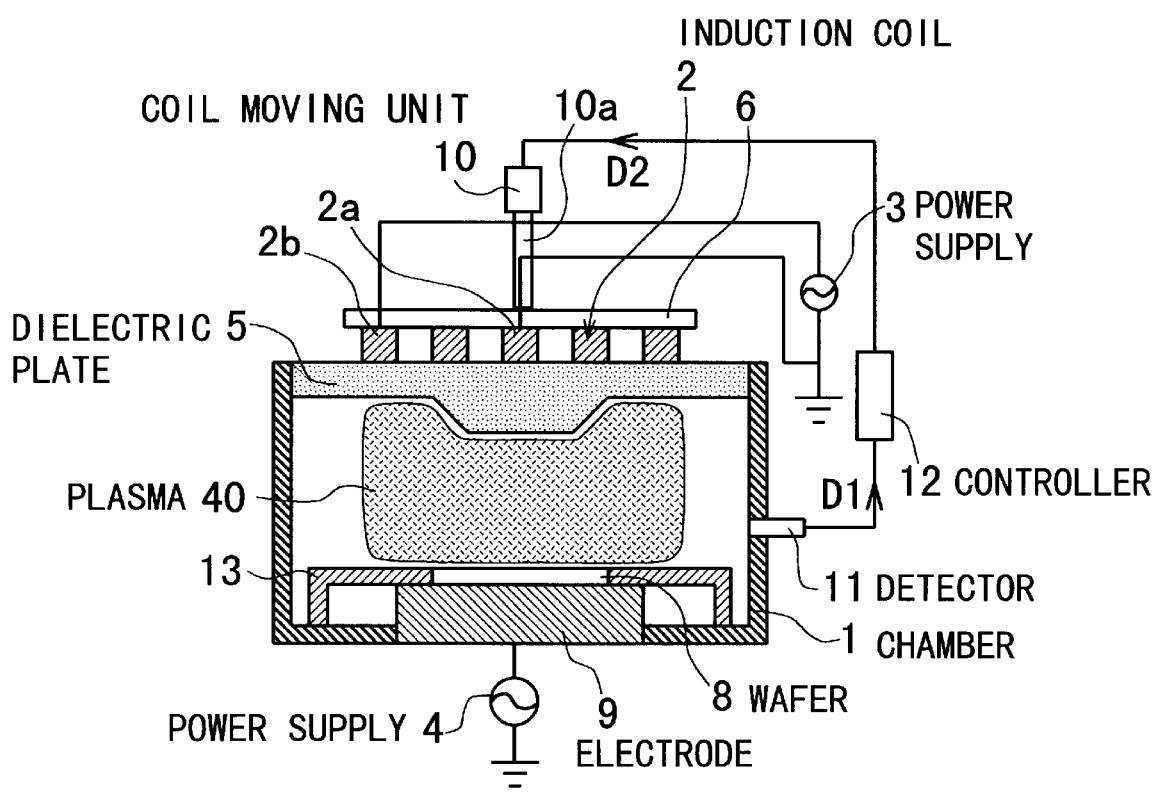
FIG. 2 is a schematic cross section of a dry etching system according to a first embodiment of the present invention.
Figure 3:
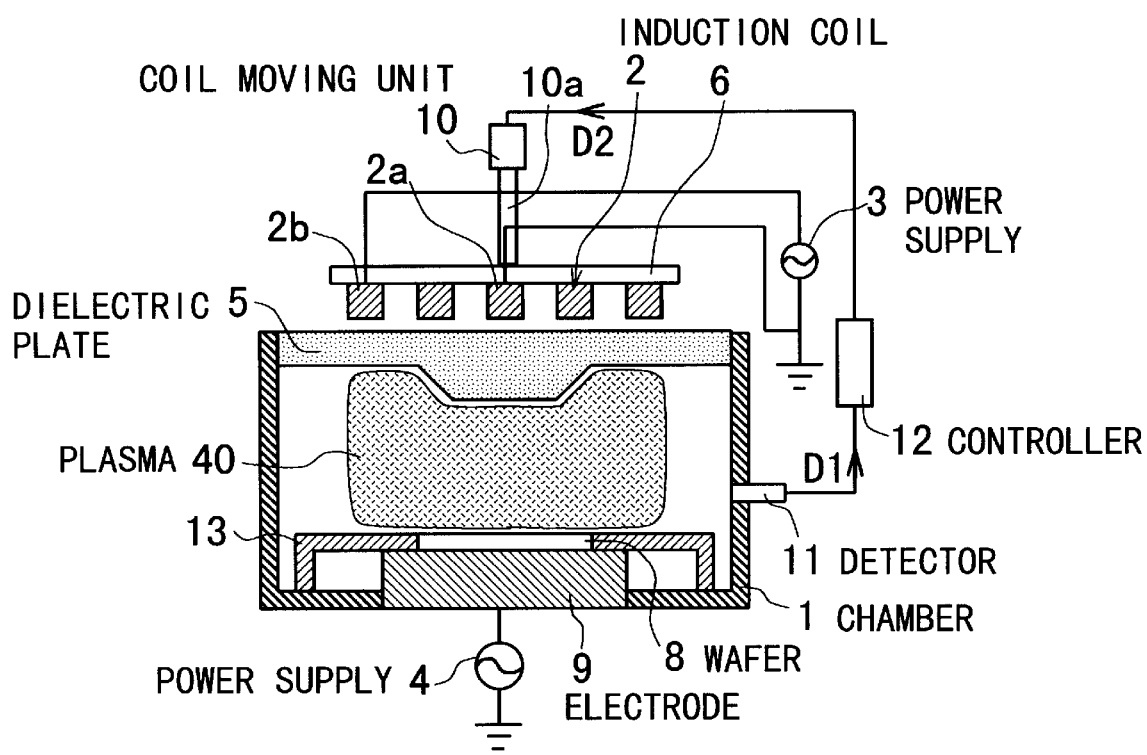
FIG. 3 is a schematic cross section of the dry etching system according to the first embodiment, in which the distance between the induction coil and the dielectric plate is increased.

As shown in FIGS. 2 and 3, a dry etching system according to a first embodiment of the present invention is of the inductively coupling type.

This system has a reaction chamber 1 electrically connected to the ground. A dielectric plate 5 is fixed to the top of a reaction chamber 1.

In the outside of the reaction chamber 1, a rf induction coil 2 is fixed onto the dielectric plate 5. The coil 2 is a flat, spiral coil, which is formed on a flat plate 6. Conducting wires of the coil 2 have a rectangular cross section. Both ends of the conducting wires are electrically connected to a rf power supply 3 arranged outside the reaction chamber 1 through an impedance tuning mechanism (not shown). The start 2a of the coil 2 is located at its center and the end 2b of the coil 2 is in its periphery.

A bottom electrode 9 is fixed to the bottom of the reaction chamber 1 to be opposite to the overlying dielectric plate 5. The electrode 9 is electrically connected to a rf power supply 4 provided outside the reaction chamber 1 through an impedance tuning mechanism (not shown). The top of the electrode 9 is located in the inside of the chamber 1. A semiconductor wafer 8 is placed on the top surface of the electrode 9 as the etch object on operation. This means that the electrode has a function of a holder for holding the wafer 8 in the chamber 1.

In the inside of the reaction chamber 1, a shield 13 is fixed. This shield 13 serves to protect the areas of the wafer 8 from the active etching species.

A detector 11 is fixed to the side wall of the reaction chamber 1. This detector 11 detects the quantity of the reaction product contained in a plasma 40 generated in the chamber 1. As the detector 11, a light emission analyzer is used here, which detects the intensity or strength of the light emission from the reaction products included in the plasma 40 at a specific wavelength range. The analyzer 11 outputs an electric signal D1 corresponding to the magnitude of the detected intensity to a coil controller 12 provided outside the chamber 1.

For example, the light emission analyzer 11 has the following configuration. The detected light from the plasma 40 is dispersed by a spectroscope (not shown) to be detected by an array of optical detectors such as photo diodes. Thus, the spectral information or data about the intensity of the light emission is obtained at several wavelengths in a specific wavelength range (for example, 220–900 nm). This spectrum information corresponds to the quantity of the reaction products contained in the plasma 40. The spectral information is photo-electrically converted to the electrical time-dependent information by the array of optical detectors. The electrical time-dependent information is sent to the controller or computer 12. In this case, because the data of the light intensity are converted to the time-dependent information, there is an advantage that the data can be processed by the computer 12 easily.

A coil moving unit 10 is provided outside the chamber 1 at a location just over the dielectric plate 5. The unit 10 is mechanically connected to the coil 2 by a connection rod 10a. The unit 10 is designed to be vertically moved in response to a control signal D2 sent from the controller 12. Due to the vertical displacement of the unit 10, the induction coil 2 is raised or lowered in a direction perpendicular to the dielectric plate 5. Thus, the distance between the coil 2 and the dielectric plate 5 can be adjusted.

FIG. 3 shows the state where the coil 2 is separated from the plate 5, i.e., the distance between the coil 2 and the plate 5 is increased.

Here, a computer is used as the controller 12. This computer 12 calculates a suitable value of the distance between the coil 2 and the plate 5 according to the electric signal D1 sent from the detector 11, thereby calculating a necessary displacement value of the coil 2. Then, the control signal D2 with the calculated displacement value is sent to the coil moving unit 10. The unit 10 is driven by the signal D2 to thereby raise or lower the coil 2 according to the calculated displacement value. Thus, the distance between the coil 2 and the plate 5 is adjusted to be optimized.

In the dry etching system according to the first embodiment of FIGS. 2 and 3, on operation, the reaction chamber 1 is exhausted to a fixed degree of vacuum and then, a specific reaction gas is introduced into the chamber 1 to represent a specific pressure. An rf electric current is supplied to the induction coil 2 from a rf power supply 3. Due to the electric current flowing through the coil 2, a rf magnetic-field (not illustrated) is induced within the reaction chamber 1 through the dielectric plate 5. This magnetic field is almost parallel to the plate 5. Because of the induced magnetic field, the plasma 40 with a high density is able to be generated within the reaction chamber 1 even if the reaction gas in the chamber 1 has a low pressure.

On the bottom electrode 9 located to be opposite to the dielectric plate 5, a semiconductor wafer 8 is located as the etch object. When a rf voltage is applied to the electrode 9, a self-bias voltage will occur on the electrode 9. Due to this self-bias voltage, the ions contained in the plasma 40 are able to arrive on the surface of the wafer 8 located on the electrode 9 along a direction almost perpendicular to the wafer 108. Thus, a highly anisotropic etching can be realized.

Figure 4:
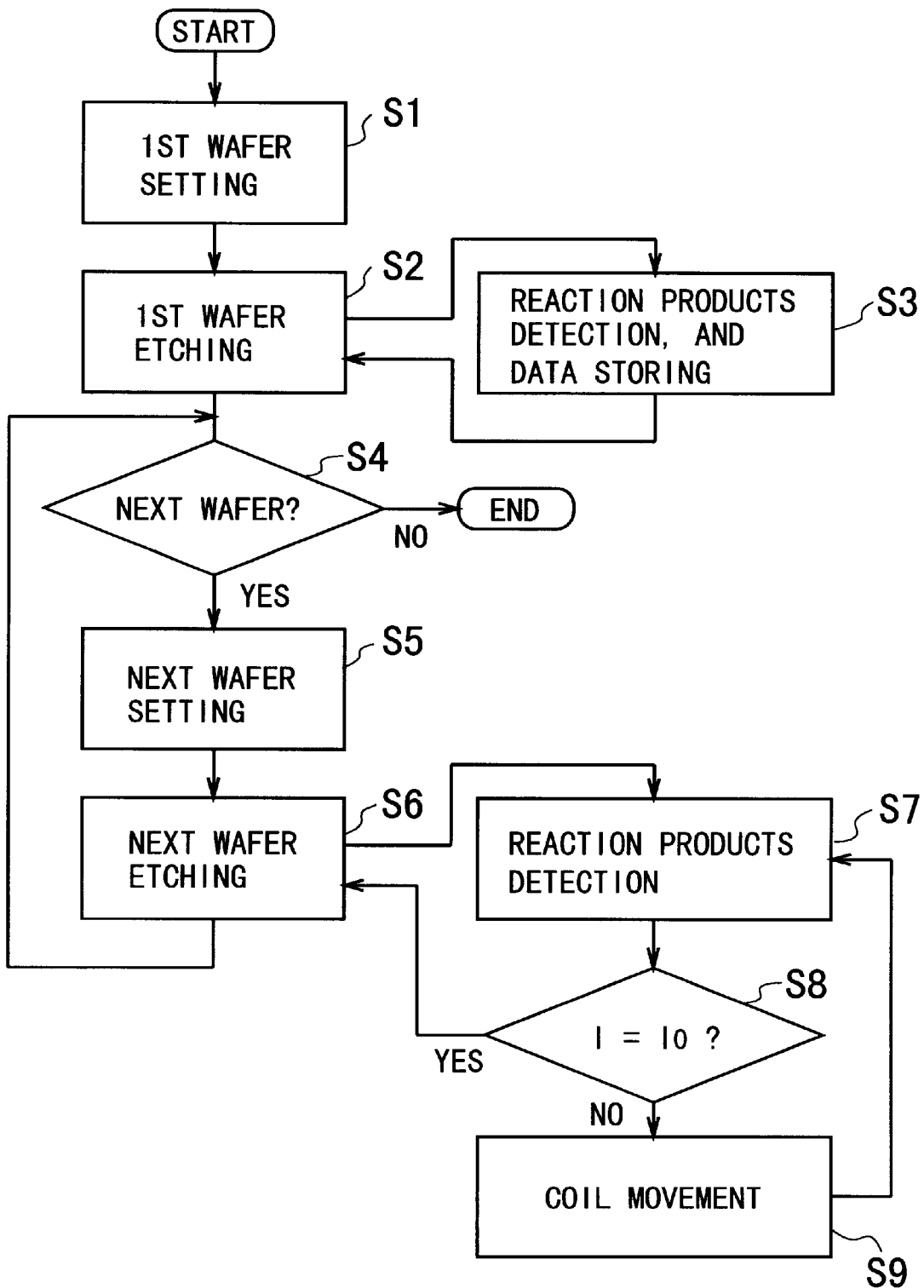
FIG. 4 is a flowchart to show a dry etching method according to a first embodiment of the present invention.

A dry etching method according to the first embodiment is performed along a flowchart shown in FIG. 4 using the dry etching system shown in FIGS. 2 and 3.

First, a first one of semiconductor wafers 8 to be etched is placed on the top of the bottom electrode 9 (step S1). Then, a specific reaction gas is introduced into the reaction chamber 1 until it represents a specific pressure. Thereafter, a rf electric current is supplied to the induction coil 2 from the rf power supply 3, and at the same time, a rf voltage is applied to the bottom electrode 9 from the power supply 4. Thus, the plasma 40 is generated in the reaction chamber 1 between the opposing dielectric plate 5 and the electrode 9, as shown in FIGS. 2 and 3. The first one of the semiconductor wafers 8 is dry-etched by the action of active species in the plasma 40 (step S2).

When this etching process is started, usually, the distance between the induction coil 2 and the dielectric plate 5 is zero. In other words, the coil 2 is in contact with the upper surface of the plate 5. However, this initial distance may be changed or adjusted according to the necessary etching condition.

The intensity or strength of the light emission from the reaction products in the plasma 40 will typically be stable when a specific time (usually, about 5 seconds) is passed from the start of etching. Therefore, the intensity of the light emission in a specific wavelength range is detected by the light emission analyzer or detector 11. The intensity data $I_o$ of the light emission thus obtained is stored in a memory device (not shown) in the controller 12 as a reference value (step S3).

Even after measuring the strength of the light emission of the reaction products in the plasma 40, the etching process is continued while controlling the emission strength to be constant, or while finely adjusting the distance between the coil 2 and the plate 5.

Subsequently it is judged whether a second one of the wafers 8 to be etched exists (step S4). If no further wafer 8 to be etched exists, the etching process is finished.

When any one of the wafers 8 to be etched exists, the second one of the wafers 8 is etched in the same way as that for the first one of the wafers 8. Specifically, the second one of the wafers 8 is put on the surface of the electrode 9 (step S5). Then, a rf electric current is supplied to the induction coil 2 from the power supply 3 and at the same time, a rf voltage is applied to the electrode 9 from the power supply 4. Due to the etching species in the plasma 40, the second one of the wafers 8 is etched (step S6).

During the step S6, in the same manner as that of the step S3, the intensity of the light emission of the reaction products in the plasma 40 is measured (step S7), thereby obtaining the intensity data I. Then, the obtained emission strength data I is compared with the reference value $I_o$ (step S8).

When $I \neq I_o$, the induction coil 2 is displaced by a specific increment by using the coil moving unit 10 while continuing the etching process, thereby adjusting the distance between the coil 2 and the dielectric plate 5 (step S9). After the completion of this adjustment, the light emission intensity is detected again and the detected value I is compared with the reference value again (steps S7 and S8). If the measured intensity value I becomes equal to the reference value $I_o$ (i.e., $I=I_o$) in the step S8, the etching is continued while keeping the coil 2 at this position. If the measured intensity value does not become equal to the reference value $I_O$ in the step S8 at this time, the steps S7, S8, and S9 are repeated until the measured intensity value I becomes equal to the reference value $I_o$.

Typically, the value of the light emission intensity for the second one of the wafers 8 will be higher than the initial standard value $I_o$.

After the etching process of the second one of the wafers 8 is finished, the process flow is turned to the step S4, and the steps S5 to S9 are repeated until all of the wafers 8 are completely etched.

With the dry etching method according to the first embodiment, during the dry etching process (step S2 or S6), the quantity of the reaction products contained in the plasma 40 is controlled to be a specific value. Therefore, the effect of the reaction products to the edge profile of the wafers can be suppressed.

Also, when the plurality of wafers 8 are successively etched in the reaction chamber 1, if the wafers 8 are etched while controlling the quantity of the reaction products contained in the plasma 40 to be a specific value, the edge profiles of the wafers 8 will be uniform. This means that each of the plurality of wafers 8 can have a wanted edge profile.

SECOND EMBODIMENT

Figure 5:
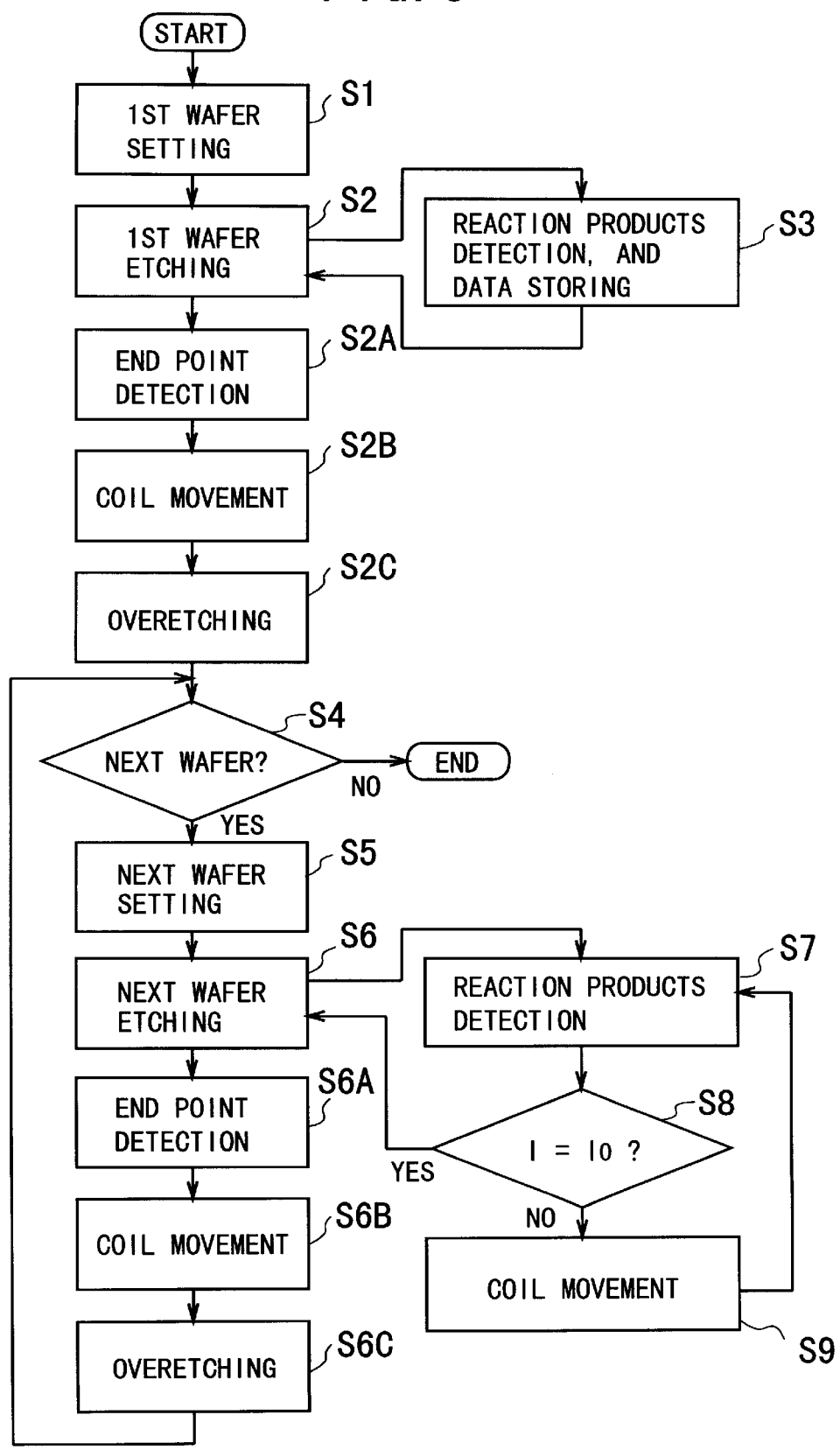
FIG. 5 is a flowchart to show a dry etching method according to a second embodiment of the present invention.

A dry etching method according to a second embodiment includes a main etching process and an overetching process, as shown in FIG. 5. This method is preferably applied to a polysilicon gate formation process of a MOSFET. This method also is performed by using the dry etching system shown in FIGS. 2 and 3.

The method according to the second embodiment is the same as that according to the first embodiment except that overetching processes are added. Therefore, by adding the same reference characters to the corresponding steps in FIG. 5, the description relating to the same processes are omitted here for the sake of simplification of description.

In FIG. 5, the steps S2, S2A, and S3 indicate a "main etching process" for a first one of the wafers 8. The steps S6, S6A, S7, S8, and S9 indicate a "main etching process" for a second one of the wafers 8 or later. During the main etching processes, the intensity of light emission from the reaction product in the plasma 40 over a specific wavelength region is controlled In FIG. 5, the step S2C indicates an "overetching process" for the first one of the wafers 8. The step S6C indicates an "overetching process" for the second one of wafers 8 or later. During the overetching processes, the etching process is started after the distance between the induction coil 2 and the dielectric plate 5 is adjusted to be zero by the coil moving unit 10 (steps S2B and S6B). The reason is as follows:

Specifically, during the overetching process, the polysilicon layer remaining on the underlying gate oxide layer as etch residues needs to be selectively removed after the completion of the main etching process without etching the gate oxide layer. When the distance between the coil 2 and the dielectric plate 5 is large, the quantity of the reaction products contained in the plasma 40 will decrease, resulting in improved anisotropy of the etching profiles.

On the other hand, there arises another problem that will degrade the etch selectivity. This problem is caused by the fact that the reaction products are utilized as a protection layer for protecting the gate oxide layer from the ion attack and that the reaction products form the protection layer with an unsatisfactory thickness due to decrease in amount of the reaction products.

The sheath voltage, which is applied to the dielectric plate 5, will increase by returning the distance between the coil 2 and the plate 5 to zero, thereby increasing the quantity of the released or sputtered reaction products from the inner surface of the dielectric plate 5 due to the ion bombardment. The reaction products emitted from the dielectric plate 5 are taken out from the chamber 1 or are redeposited on the wafers 8. The gate oxide layer is protected by the redeposited reaction products from the etching action due to the ion bombardment.

To raise the redeposition probability of the reaction products, it is effective that any temperature difference or gradient exists among the reaction chamber 1 and the dielectric plate 5 and the wafer 8 using a temperature adjusting subsystem of the dry etching system shown in FIGS. 2 and 3. For example, the temperature is preferably set to satisfy the condition of reaction chamber 1>dielectric plate 5>wafer 8.

For example, a temperature gradient is given in such a way that the reaction chamber 1 has a temperature of 60° C., the dielectric plate 5 has a temperature of 40° C., and the wafer 8 has a temperature of 20° C. The redeposition probability of the reaction products tends to increase with the increasing temperature gradient.

As described above, with the dry etching method according to the second embodiment, the quantity or amount of the reaction products emitted toward the plasma 40 is controlled or adjusted to improve the etch anisotropy. On the other hand, during the overetching time, by setting the distance between the induction coil 2 and the dielectric plate 5 to zero, the quantity or amount of the reaction products sputtered by the ion bombardment from the plate 5 is increased to thereby improve etch selectivity.

The dry etching method according to the second embodiment is explained below along a flowchart shown in FIG. 5.

First, a first one of the semiconductor wafers 8 to be etched is placed on the top of the bottom electrode 9 and then, the main etching process for the first one of the wafers 8 is carried out (steps S1 and S2). The intensity of the light emission in the specific wavelength range is detected by the light emission analyzer or detector 11. The intensity data $I_o$ of the light emission thus obtained is stored in a memory device (not shown) in the controller 12 as a reference value (step S3).

Even after measuring the strength of the light emission of the reaction products in the plasma 40, the main etching process is continued while controlling the emission strength to be constant, or while finely adjusting the distance between the coil 2 and the plate 5.

When the end point of the main etching process is detected (step S2A), the coil 2 is moved so that the distance between the coil 2 and the plate 5 is zero (step S2B). Thereafter, the over etching process is performed while keeping this state (step S2C).

Next, it is judged whether a second one of the wafers 8 to be etched exists (step S4). If no further wafer 8 to be etched exists, the etching process is finished.

When any one of the wafers 8 to be etched exists, the second one of the wafers 8 is etched in the same way as that for the first one of the wafers 8. Specifically, the second one of the wafers 8 is put on the surface of the electrode 9 (step S5) and then, the second one of the wafers 8 is etched due to the etching species in the plasma 40 (step S6).

During the step S6, in the same manner as that of the step S3, the intensity of the light emission of the reaction products in the plasma 40 is measured (step S7), thereby obtaining the intensity data I. Then, the obtained emission strength data I is compared with the reference value $I_o$ (step S8).

When I≠$I_o$, the induction coil 2 is displaced by a specific increment by using the coil moving unit 10 while continuing the main etching process, thereby adjusting the distance between the coil 2 and the dielectric plate 5 (step S9) After the completion of this adjustment, the light emission intensity is detected again and the detected value I is compared with the reference value again (steps S7 and S8). If the measured intensity value I becomes equal to the reference value $I_o$ (i.e., I=$I_o$) in the step S8, the etching is continued while keeping the coil 2 at this position. If the measured intensity value does not become equal to the reference value $I_o$ in the step S8 at this time, the steps S7, S8, and S9 are repeated until the measured intensity value I becomes equal to the reference value $I_o$.

After the etching process of the second one of the wafers 8 is finished, the process flow is turned to the step S4, and the steps S5 to S9 are repeated until all of the wafers 8 are completely etched.

With the dry etching method according to the second embodiment, the second to last ones of the wafers 8 are etched while controlling the quantity of the reaction products contained in the plasma 40 to be equal to the reference value for the first one of the wafers 8. Therefore, the edge profiles of the wafers 8 will be uniform. This means that each of the wafers 8 can have a wanted edge profile.

TEST

Figure 6:
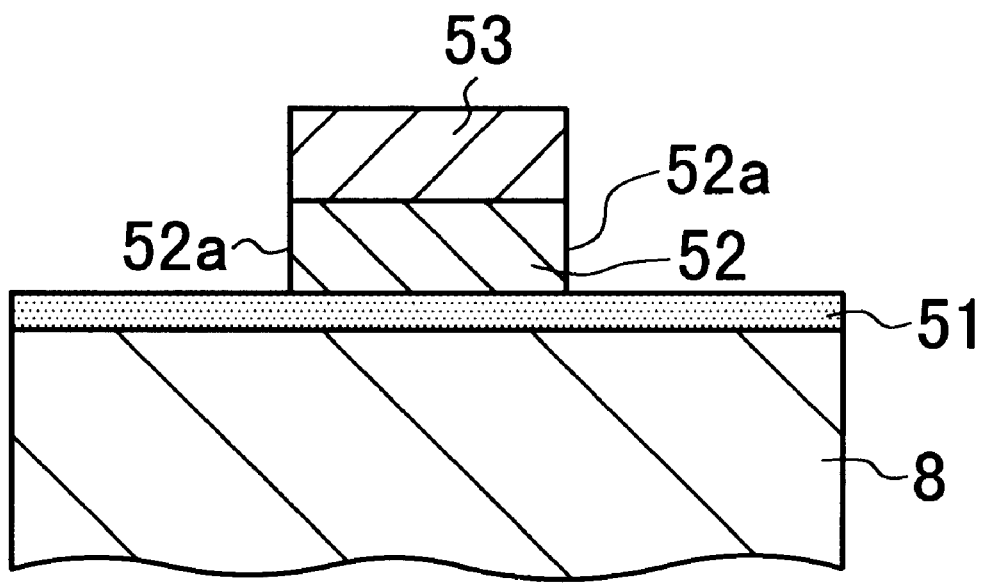
FIG. 6 is schematic cross section of a MOSFET with a polysilicon gate electrode, which shows a case where the dry etching method according to the second embodiment is applied.

To confirm the advantages of the present invention, in the same manner as that of the dry etching method according to the second embodiment, as shown in FIG. 6, a polysilicon gate electrode 52 was formed by etching a polysilicon layer on a gate oxide layer 51 of a MOSFET by the inventor using a patterned resist mask 53 formed on the polysilicon layer. A gate oxide layer 51 was formed on the surface of the silicon wafer or substrate 8.

First, as shown in FIG. 2, after the wafer 8 with a diameter of 6 inches is located on the surface of the bottom electrode 9, the distance between the opposing wafer 8 and the dielectric plate 5 was adjusted to be 5 cm. As the reaction gas, a gaseous mixture of $Cl_2$, HBr, and $O_2$ was introduced into the reaction chamber 1. The gas pressure in the chamber 1 was adjusted at several mTorr. As the reaction gas, at least one of $Cl_2$ and HBr may used.

A rf electric voltage with a frequency of 13.56 MHz was supplied to the induction coil 2 from the power supply 3, thereby generating the plasma 40 in the chamber 1.

Thereafter, (a) breakthrough (b), main etching (c), and overetching processes were successively performed. During the (a) breakthrough process, a rf power of 100 W was supplied to the bottom electrode 9 from the power supply 4, and the native oxide layer formed on the surface of the polysilicon layer 52 was removed. During the (b) main etching and (c) overetching processes, a rf power of 20 W was supplied to the bottom electrode 9 from the power supply 4.

The light emission analyzer 11 detected the intensity of light emission from the $SiCl_x$ molecules as the reaction products in the wavelength range of 282 nm and 288 nm. However, any other wavelength range may be selected according to the sort of the reaction products.

The light emission intensity data in the specific wavelength range thus obtained were sent to the computer or controller 12. The program of the computer 12 was designed to realize the process steps S1 to S9 in FIG. 5.

The distance between the induction coil 2 and the dielectric plate 5 was designed to be displaced in the range from 0 mm to 10 mm. However, this range may be from 0 mm to 15 mm.

Figure 7:
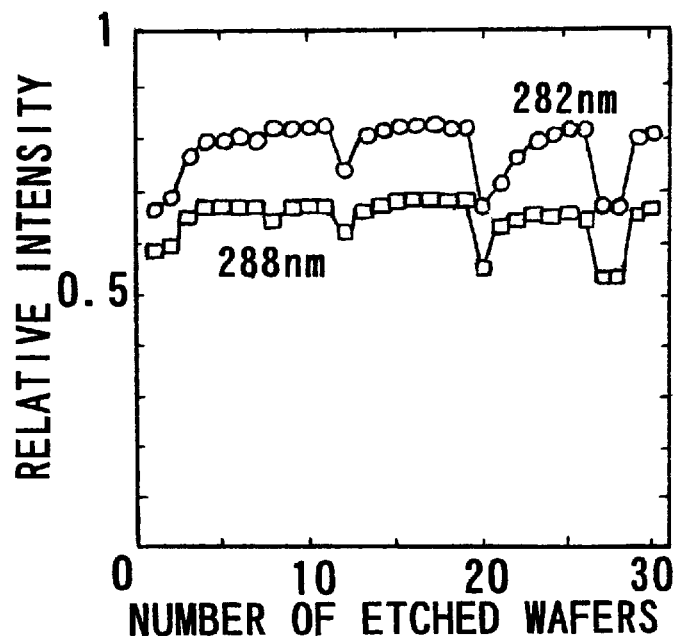
FIG. 7 is a graph showing the relationship between the number of etched semiconductor wafers and the relative intensity of light emission from the plasma according to the second embodiment.

30 wafers 8 were successively etched in the same chamber 1. The relationship between the number of the etched wafers 8 and the relative intensity of light emission from the plasma 40 is shown in FIG. 7. The relationship between the number of the etched wafers 8 and the angle θ of the vertical side face 52a of the polysilicon gate electrode 52 is shown in FIG. 8.

For comparison, 30 wafers 8 were etched by the conventional etching method described previously (in other words, without controlling the intensity of light emission of the plasma 40). The results are shown in FIGS. 9 and 10.

Figure 9:
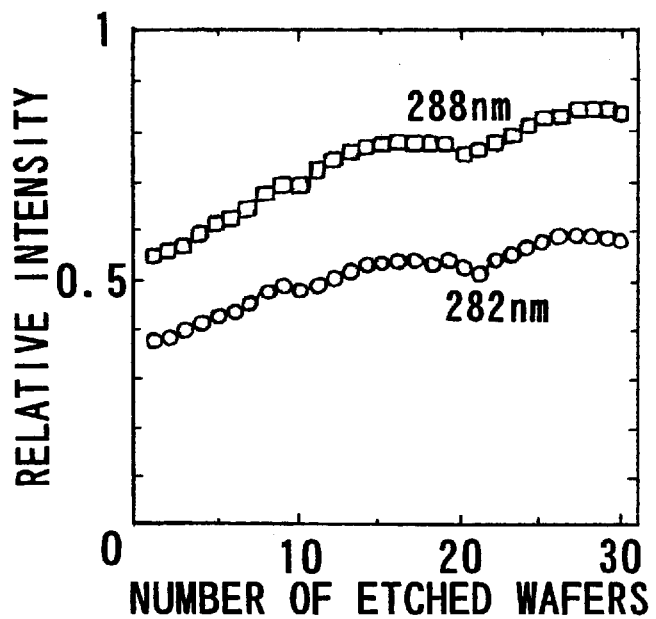
FIG. 9 is a graph showing the relationship between the number of etched semiconductor wafers and the relative intensity of the light emission from the plasma according to the conventional method.
Figure 10:
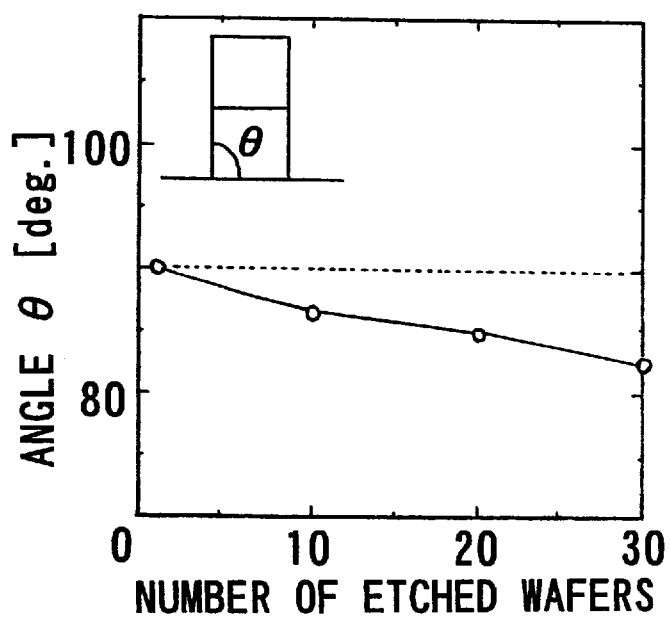
FIG. 10 is a graph showing the relationship between the number of etched semiconductor wafers and the angle θ of the vertical side face of the polysilicon gate electrode according to the conventional method.

As seen from FIGS. 9 and 10, with the conventional method, the intensity of light emission increases with the increasing number of the etched wafers 8. Also, the angle θ of the side face 52a of the gate electrode 52 decreases with the increasing number of the etched wafers 8. In particular, when the number of the etched wafers 8 is near 30, the angle θ is decreased from 90° to 82–83°.

Figure 8:
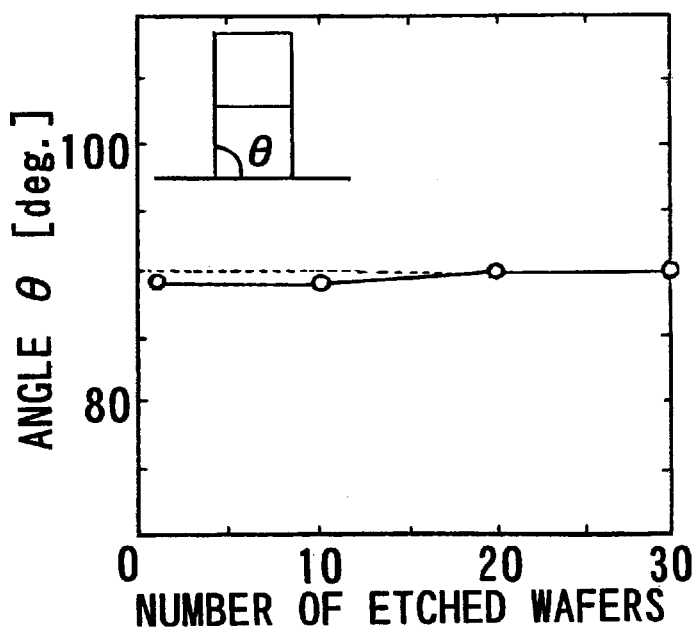
FIG. 8 is a graph showing the relationship between the number of etched semiconductor wafers and the angle θ of the vertical side face of the polysilicon gate electrode according to the second embodiment.

On the other hand, according to the method of the present invention, as seen from FIGS. 7 and 8, the intensity of light emission is kept approximately constant independent of the increasing number of the etched wafers 8. Therefore, the angle θ of the side face 52a is kept approximately constant independent of the increasing number of the etched wafers 8.

As a result, it is seen that the etch profile of the finished gate electrode 52 can be left approximately uniform in the method according to the method of the present invention.

The reason that the quantity of the reaction products can be kept constant by adjusting the distance between the induction coil 2 and the dielectric plate 5 is as follows.

For example, when the reduction products contained in the plasma 40 increases from its initial value, the ratio of the inductively coupling component to the capacitively coupling component is reduced by increasing the distance between the induction coil 2 and the dielectric plate 5. Thus, the sheath voltage applied to the dielectric plate 5 decreases and therefore, the ion energy in the plasma 40 is restrained. This reduces the quantity of the reaction products sputtered from the inner surface of the dielectric plate 5 toward the plasma 40 by ion bombardment. Consequently, the quantity of the reaction products in the plasma 40 can be reduced.

In the above-mentioned embodiments, dry etching systems of the inductively coupled type are explained. However, the present invention is not limited thereto. The invention may be applied to any type of the dry etching system and method such as Electron Cyclotron Resonance (ECR) etching systems, parallel-plate Reactive Ion Etching (RIE) systems.

The amount of the reaction products in the plasma 40 is controlled by adjusting the distance of the induction coil 2 from the dielectric plate 5 in the above embodiments. However, any other means or method may be applied. For example, a similar effect or advantage can be obtained by inserting a suitable shielding plate between the coil 2 and the dielectric plate 5, or by adjusting the temperature of the dielectric plate 5.

Additionally, a polysilicon layer is etched in the above embodiments. However, the present invention may be applied to any other material such as single-crystal silicon, refractory metals.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A dry etching method comprising the steps of:
   preparing a reaction chamber into which a reaction gas has been introduced;
   inducing with an induction coil through a dielectric plate a magnetic field in said chamber;
   generating a plasma in said chamber; and
   dry etching an etch object in said chamber using said plasma to have a wanted profile;
   wherein in said dry etching step, the quantity of said reaction product contained in said plasma is controlled to be at least one specific value by control of said induction coil.

2. The method of claim 1, wherein the control of the quantity of said reaction product in said plasma is performed based on the detected emission intensity at a specific wavelength.

3. A dry etching method comprising the steps of:

preparing a reaction chamber into which a reaction gas has been introduced;

generating a plasma in said chamber; and dry etching an etch object in said chamber using said plasma to have a wanted profile;

wherein in said dry etching step, the quantity of said reaction product contained in said plasma is controlled to be at least one specific value, and wherein the control of the quantity of said reaction product in said plasma is performed using a dielectric plate fixed to said reaction chamber and a movable induction coil provided in the vicinity of said plate outside said chamber in such a way that the distance between said dielectric plate and said induction coil is adjusted to be at least one specific value.

4. The method of claim 3, wherein said reaction chamber, a dielectric plate, and said etching object are maintained to have a temperature gradient.

5. The method of claim 3, wherein after an end point of said dry etching step is detected, a step of increasing the quantity of said reaction product in said plasma and a step of overetching said object are additionally performed.

6. The method of claim 5, wherein said step of increasing the quantity of said reaction product comprises the step of reducing the distance between said movable induction coil and said dielectric plate.

7. A dry etching method comprising the steps of:

preparing a reaction chamber into which a reaction gas has been introduced;

generating a plasma in said chamber;

dry etching a first etch object in said chamber using said plasma to have a wanted profile; and dry etching a second etch object in said chamber using said plasma to have said wanted profile;

wherein in said dry etching step for said first etch object, the quantity of said reaction product contained in said plasma is detected to be stored as a reference value;

and wherein in said dry etching step for said second etch object, the quantity of said reaction product contained in said plasma is controlled to be equal to the reference value.

8. The method of claim 7, wherein in said dry etching step for said second etch object the control of the quantity of said reaction product in said plasma is performed based on said detected emission intensity at a specific wavelength.

9. The method of claim 7, wherein in said dry etching step for said second etch object the control of the quantity of said reaction product in said plasma is performed using a dielectric plate fixed to said reaction chamber and a movable induction coil provided in said vicinity of said plate outside said chamber in such a way that the distance between said dielectric plate and said induction coil is adjusted to be the at least one specific value.

10. The method of claim 7, wherein said reaction chamber, a dielectric plate, and said etching object are maintained to have a temperature gradient.

11. A dry etching system comprising:

a reaction chamber in which an etching action is performed;

a plasma generator for generating plasma in said reaction chamber;

a holder for holding an etch object in said reaction chamber;

a detector for detecting the quantity of a reaction product contained in said plasma; and a controller for controlling the amount of said reaction products contained in said plasma to be at least one specific value by changing a magnetic field induced in said chamber by an induction coil through a dielectric plate;

wherein said etch object is etched by the action of etching species contained in said plasma.

12. The system as claimed in claim 11, wherein said detector detects the intensity of light emission from said plasma at a specific wavelength.

13. A dry etching system comprising:

a reaction chamber in which an etching action is performed;

a plasma generator for generating plasma in said reaction chamber;

a holder for holding an etch object in said reaction chamber;

a detector for detecting the quantity of a reaction product contained in said plasma; and a controller for controlling the amount of said reaction products contained in said plasma to be at least one specific value;

said plasma generator comprising a dielectric plate fixed on said reaction chamber, a movable induction coil provided in the vicinity of said dielectric plate outside said reaction chamber; and an electrode fixed to said chamber and serves as a holder for said etch object;

said controller comprising a distance adjuster for adjusting the distance between said dielectric plate and said induction coil, and a linker for linking the operations of the adjuster and the detector; and wherein said etch object is etched by the action of etching species contained in said plasma.

* * * * *